Oct. 24, 1961 W. M. FOX 3,005,257

FABRICATION OF SEMICONDUCTOR DEVICES

Filed Aug. 28, 1958

INVENTOR
W. M. FOX
BY
Arthur J. Torsiglieri
ATTORNEY

United States Patent Office 3,005,257

Patented Oct. 24, 1961

3,005,257
FABRICATION OF SEMICONDUCTOR DEVICES

William M. Fox, Bethlehem, Pa., assignor to Bell Telephone Laboratories, Incorporated, New York, N.Y., a corporation of New York Filed Aug. 28, 1958, Ser. No. 757,736
1 Claim. (Cl. 29—471.1)

This invention relates to the fabrication of semiconductor devices and, more particularly, to a method of bonding attachments simultaneously to a number of semiconductor elements of the alloy junction type.

One widely used type of semiconductor device is characterized by one or more PN junctions produced by the fusion of a small metallic element or pellet containing a significant impurity to a body of single crystal semiconductor material, such as germanium or silicon. For example, PNP alloy junction transistors are fabricated by alloying indium pellets simultaneously to opposite surfaces of an N-type single crystal germanium wafer. This process is carried out in a precisely controlled furnace and is amenable to batch production of alloy semiconductor elements.

However, the ensuing step in the device fabrication process, which involves the attachment of leads and mounting of the alloyed element, is customarily a manual operation requiring some degree of skill which, therefore, limits this stage of manufacture to individual unit production.

In accordance with this invention, the alloy junction semiconductor element is placed in a mounting and in contact with solder coated lead attachments, heated to a temperature just above the melting point of the solder and then subjected to a number of low intensity shocks which result in improved bonds between the semiconductor electrodes and leads of the device assembly. More importantly, this process step is carried out on a large number of device assemblies simultaneously in a single jig, thus eliminating the more costly and time-consuming, individual manual operation.

Therefore, an object of this invention is an improved alloy junction semiconductor device.

A further object is to facilitate the fabrication of alloy junction semiconductor devices.

It is also an object to enable the assembly of alloy junction devices on a batch basis to reduce the cost of such devices.

The method of this invention, involving the application of relatively low shock impulses to a jig loaded with a number of device assemblies, serves to insure satisfactory bonds between the mounting and leads and the alloyed element as a result of the wiping action which penetrates the oxide films which inherently form on the electrode surfaces. Using previous assembly methods as noted above, it is necessary for an operator to agitate lead members by hand while the semiconductor element is at an elevated temperature in order to penetrate the oxide film on the electrodes to insure a satisfactory mechanical and electrical bond. This operation is carried out under a microscope and because it is also limited to an individual unit basis renders the cost of the units considerably greater than is the case using the batch technique of this invention. Further, in accordance with this invention, the lead attachment to the upper electrode of an alloy junction semiconductor element is a metal plate or tab which provides contact over a relatively large area with the electrode.

Thus, a feature of this invention is the L-shaped metal bracket or tab which has one portion precoated with solder for making contact with the upper electrode of the semiconductor element.

Another feature of this invention is the mechanical arrangement for applying shock impulses to a number of semiconductor device assemblies while at an elevated temperature.

Another feature is a jig for securely mounting a relatively large number of semiconductor devices in an arrangement suitable for undergoing shock accelerations while at an elevated temperature.

The invention and its further objects and features will be more clearly understood from the following detailed description taken from the drawing in which.

Figure 1:
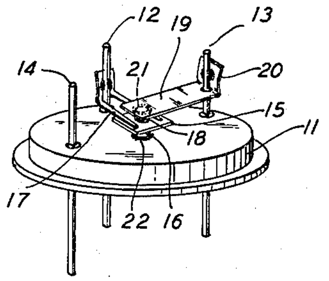
FIG. 1 is a perspective of an alloy junction transistor assembly showing the transistor element mounted on the header and with leads attached.
Figure 2:
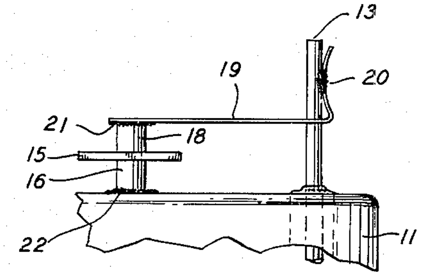
FIG. 2 is a detail showing the transistor element mounted between the header and upper electrode lead.

As shown in FIGS. 1 and 2, an alloyed transistor element is prepared for mounting on a flanged header 11. The transistor element consists of a germanium wafer 15 of single crystal N-type germanium, a collector electrode 17 and an emitter electrode 16. This assembly, herein referred to as an alloy junction transistor element, is produced by alloying pellets of indium in a precisely controlled furnace to the opposite faces of the germanium wafer. During this alloying process a pair of gold-plated Kovar leads 18 and a gold washer are alloyed to one face of the germanium wafer to provide low resistance connections to the base region of the transistor element.

As a preliminary operation, the L-shaped bracket member 19 is coated with solder on the underside 21 and the surface of the header is likewise coated over a small portion 22. A solder of equal amounts of tin and indium and having a melting point of 117 to 127 degrees centigrade has been found very satisfactory. This pretinning operation is carried out at about 150 degrees centigrade and sufficient solder is used to produce a film .001 inch thick covering an area of approximately .004 square inch. More generally, the solder coat may have a thickness of up to .0015 inch spread over an area .060 x .060 inch to .070 x .070 inch.

The structure of FIG. 1 is then assembled by positioning the transistor element with the emitter electrode 16 in the center of the solder-coated portion of the header 11. The base leads 18 then are welded to the base terminal 12. The metal bracket member 19 is mounted on the collector terminal 13 as shown and welded to the terminal 13 in the region 20. At this point the horizontal portion of the bracket 19, the wafer 15 and the surface of the header 11 are placed in substantially parallel relation by mutual adjustment and alignment of these parts. This procedure insures good contact at the bonding areas and avoids any possibility of short-circuiting the wafer to the header. A slight compression between the bracket 19 and the header 11 is desirable to compensate for slight variations in the height of individual alloy junction transistor elements. Sufficient compression is provided for this purpose by spring loading the bracket 19 while it is being welded to the collector terminal 13.

Figure 3:
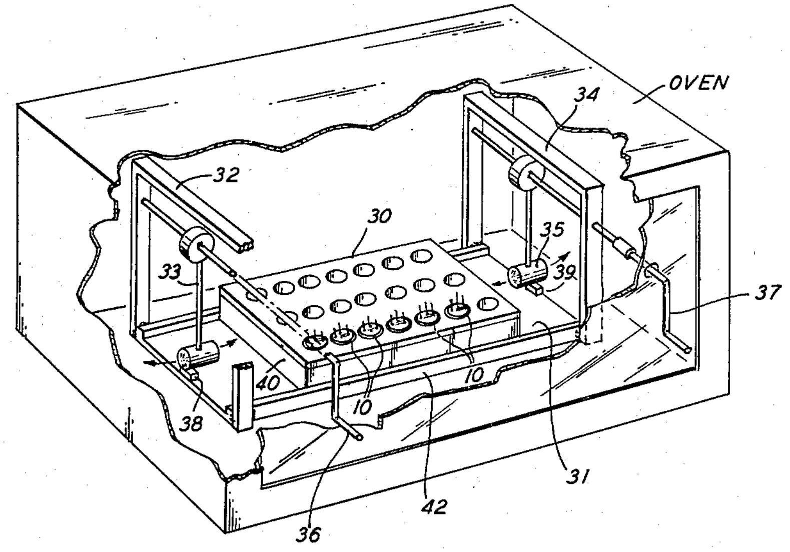
FIG. 3 is a schematic depiction of an arrangement for simultaneously heating and applying shock impulses to a jig containing a number of the device assemblies of FIG. 1.

As the next step, a number of the assemblies shown in FIG. 1 are placed in a jig 30, as seen in FIG. 3. In this case, the jig is shown as capable of holding 21 device assemblies, although it will be apparent that apparatus may be designed to handle even larger numbers. The jig 30 comprises a base block 40 and a cover 41 with suitable recesses to enable clamping the flange of each device assembly securely between the cover and base block. Because the temperatures involved are relatively low, the jig may be of any readily available material, such as brass. The jig is slideably mounted in a base 42 having sides which enable the jig to move longitudinally. End stops 38 and 39 are provided to prevent the jig from travelling beyond the ends of the base member 42. At the ends of the base member 42 are vertical frames or gallows 32 and 34 which support small hammers 33 and 35 which are controlled by extension cranks 36 and 37 passing through stuffing boxes in the walls of the enclosing oven which is shown in outlines surrounding the entire apparatus. Pyrex glass inserts, not shown, may be provided in the oven walls to enable observation of the process within the oven.

After the device assemblies 10 are mounted in the jig 30 and placed in the oven, the temperature is raised to about 130 degrees centigrade. A clean atmosphere should be provided within the oven, for example, clean, dry air or nitrogen. After the assembly has reached thermal equilibrium, which may, typically, require a period of about one-half hour, the device assemblies 10 are subjected to a series, of at least three, of shock impulses by striking the ends of the jig 30 alternately with the small hammers 33 and 35. The interval between impulses advantageously is about ten seconds. A minimum impulse of about .027 pound/second is required to produce a satisfactory solder bond between the bracket member 19 and the collector electrode 17 and the solder-coated header 11 and the emitter electrode 16. Generally, shocks of greater intensity are satisfactory and the maximum tolerable in the magnitude of the impulse applied is subject only to the requirement of avoiding structural damage to the apparatus. It appears that the shocks and vibrations produced thereby provide a wiping or scrubbing action which sweep aside the inherent oxide films on the electrodes 16 and 18 and thereby insure satisfactory solder bonds. In the arrangement of FIG. 3, the jig 30 has a mass of 525 grams and attains a velocity of .75 foot/second, travelling a distance of about one-half inch.

Other precautions to be observed in carrying out the process of this invention relate to cleanliness. In preparing the device assembly 10 of FIG. 1, after the metallic members, namely, the header 11 and bracket 19, are tinned, they are rinsed in deionized water and stored, if necessary, under conditions which will preclude the formation of heavy oxides or the accumulation of dirt and dust.

After completion of the bond, the semiconductive elements are removed from the jig, etched and encapsulated in the usual fashion.

Although the invention has been disclosed in a specific form, it is obvious that alternative arrangements will be suggested to those skilled in the art which will be within the scope and spirit of the invention.

What is claimed is:

In the fabrication of a semiconductor device including a mounting member comprising a header and terminal members, the steps of mounting and connecting an alloy junction transistor element comprising solder coating a central portion of said header member, solder coating one face of a metal plated member, welding said plated member to a terminal of said header, mounting said transistor element between said plated member and said header and in contact with the solder-coated portions of said plated member and said header, securing the assembly in a metal jig, heating the assembly in an oven to at least the melting temperature of the solder and simultaneously subjecting the assembly to a series of low intensity accelerations of small amplitude and at a frequency of one every one to ten seconds thereby to expedite bonding of said transistor element to said header and said plated member.

References Cited in the file of this patent

UNITED STATES PATENTS

| | | |
|---|---|---|
| 1,181,741 | Coolidge | May 2, 1916 |
| 1,508,076 | Taylor | Sept. 9, 1924 |
| 2,094,495 | Robinson et al. | Sept. 28, 1937 |
| 2,301,291 | Harrington | Nov. 17, 1942 |
| 2,306,291 | Alons | Dec. 22, 1942 |
| 2,406,310 | Agule | Aug. 27, 1946 |
| 2,426,650 | Sivian | Sept. 2, 1947 |
| 2,485,444 | Hofberg | Oct. 18, 1949 |
| 2,524,297 | Quam | Oct. 3, 1950 |
| 2,662,500 | Fort et al. | Dec. 15, 1953 |
| 2,763,822 | Frola et al. | Sept. 18, 1956 |
| 2,813,502 | Drom | Nov. 19, 1957 |
| 2,833,238 | Jones et al. | May 6, 1958 |
| 2,867,899 | Jacobs | Jan. 13, 1959 |

FOREIGN PATENTS

| | | |
|---|---|---|
| 604,193 | Great Britain | June 30, 1948 |